United States Patent
Parulkar et al.

(10) Patent No.: US 7,127,640 B2
(45) Date of Patent: Oct. 24, 2006

(54) ON-CHIP TESTING OF EMBEDDED MEMORIES USING ADDRESS SPACE IDENTIFIER BUS IN SPARC ARCHITECTURES

(75) Inventors: Ishwardutt Parulkar, San Francisco, CA (US); Chitresh C. Narasimhaiah, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 508 days.

(21) Appl. No.: 10/611,467

(22) Filed: Jun. 30, 2003

(65) Prior Publication Data

US 2005/0015671 A1    Jan. 20, 2005

(51) Int. Cl.
G06F 11/00    (2006.01)
(52) U.S. Cl. ...................................................... 714/30
(58) Field of Classification Search .................. 714/30
See application file for complete search history.

(56) References Cited

U.S. PATENT DOCUMENTS

| | | | |
|---|---|---|---|
| 5,173,906 A * | 12/1992 | Dreibelbis et al. .......... 714/733 |
| 5,491,793 A * | 2/1996 | Somasundaram et al. ..... 714/45 |
| 5,553,082 A * | 9/1996 | Connor et al. .............. 714/733 |
| 5,568,437 A * | 10/1996 | Jamal ......................... 365/201 |
| 5,577,050 A * | 11/1996 | Bair et al. ................... 714/710 |
| 5,764,878 A * | 6/1998 | Kablanian et al. .............. 714/7 |
| 5,822,228 A * | 10/1998 | Irrinki et al. ................ 714/718 |
| 5,825,785 A | 10/1998 | Barry et al. ................ 371/22.4 |
| 5,982,681 A | 11/1999 | Schwarz ..................... 365/201 |
| 6,067,262 A * | 5/2000 | Irrinki et al. ................ 365/201 |
| 6,367,042 B1 | 4/2002 | Phan et al. .................. 714/733 |
| 6,397,349 B1 | 5/2002 | Higgins et al. ................. 714/7 |

OTHER PUBLICATIONS

Marc E. Levitt, Designing UltraSparc for Testability Design & Test of Computers, IEEE vol. 14, Issue 1, Jan.-Mar. 1997 pp. 10-17.*
Parulkar, I. et al., A scalable, low cost design-for-test architecture for UltraSPARC/spl trade/ chip multi-processors Test Conference, 2002. Proceedings. International===Oct. 7-10, 2002 pp. 726-735.*
Wolfe, Michael, "High Performance Compilers For Parallel Computing", Oregon Graduate Institute of Science & Technology, Chapter 6, pp. 166-223, Addison-Wesley Publishing Company, Inc. (1996).

* cited by examiner

Primary Examiner—Robert Beausoliel
Assistant Examiner—Elmira Mehrmanesh
(74) Attorney, Agent, or Firm—Gunnison, McKay & Hodgson, L.L.P.

(57) ABSTRACT

A system for on-chip testing of embedded memories using Address Space Identifier (ASI) bus in Scalable Processor ARChitecture (SPARC) microprocessors. An integrated circuit includes a plurality of memory arrays, Address Space Identifier (ASI) bus interface logic connected by an ASI bus to the plurality of memory arrays, and a memory control unit and a memory built-in self-test (MBIST) engine connected to the ASI bus interface logic. Rather than direct access, the MBIST engine utilizes the ASI bus interface logic and the ASI bus to perform memory testing. The MBIST engine, programmed with memory array parameters, includes a programmable state machine controller to which is connected a programmable data generator, a programmable address generator, and a programmable comparator. The data generator provides data as appropriate. The address generator provides addresses as appropriate. The comparator provides test results information for the particular test situation. The MBIST engine generates a test status output.

19 Claims, 3 Drawing Sheets

ON-CHIP TESTING OF EMBEDDED MEMORIES USING ADDRESS SPACE IDENTIFIER BUS IN SPARC ARCHITECTURES

FIELD OF THE INVENTION

The present invention relates generally to built-in self-test of embedded memories in integrated circuits. More specifically, the present invention relates to memory built-in self-test of Scalable Processor ARChitecture microprocessor integrated circuits.

BACKGROUND OF THE INVENTION

In the integrated circuit industry, it has long been the practice to locate both data processing circuitry and memory storage circuitry on the same integrated circuit (IC) or "chip." This is especially the case for complex ICs such as microprocessors. In fact, there are typically a number of different memory arrays on a single microprocessor chip. The memory arrays can come in different forms and sizes and may perform a variety of general or dedicated functions. For example, one memory array may be an instruction cache and another may be a data cache. At various times in the life of any IC, it becomes necessary or desirable to test these memory arrays for structural defects. Conventionally, memory array testing can be performed by providing test stimulus and observing test response externally, internally, or a combination of the two. As the number and complexity of the memory arrays have increased, the dependence on external testing alone has decreased. External testing requires expensive tester resources such as automatic test equipment (ATE). Also, external testing alone is performed at a slower speed than can be achieved through internal testing. Internal testing can be performed at the rated speed of the chip being tested. At-speed testing takes less time and gives better defect detection capability. Memory testing by way of internal or on-chip circuitry is known as memory built-in self-test (memory BIST or MBIST) or array built-in self-test (array BIST or ABIST). Generally, the main component of the circuitry, called an MBIST engine, performs one or more test algorithms on one or more of the various memory arrays. For memory testing, one class of algorithms is known as the March algorithms for the methodical way the test sequence advances from one memory location to another. There are a number of March algorithms popular in the industry because the various test algorithms target different defect mechanisms or faults. It may be that more than one test algorithm is desired or required to identify the various types of faults. For example, one March algorithm, known as the moving inversions (MOVI) test, sequentially writes and reads through the memory array in such a way that all single stuck-at faults, address faults, transition faults, and coupling faults in the memory array may be detected. Generally, the on-chip test circuitry is organized in either a central or a distributed configuration. In the central configuration, there is one MBIST engine which controls the testing of all of the various memory arrays. In the distributed configuration, there is a dedicated MBIST engine that controls the testing of a specific memory array. Each of the dedicated MBIST engines is located in close proximity to its associated memory array. By general comparison, the former has less circuitry that is more complicated and the latter has more total circuitry that is less complicated. Further, the former has more wire routing in terms of length than the latter.

Taken together, the memory space of the various memory arrays in the IC can be logically viewed as the complete address space of the IC. The individual memory arrays are then viewed as a logical partition of this unified address space. The individual memory arrays can be identified by their address locations in the unified address space. One example of such organization, called the Address Space Identifier (ASI) architecture, is provided by the Scalable Processor ARChitecture (SPARC) microprocessor specification. The SPARC specification is an open specification created by the SPARC Architectural Committee of SPARC International. One can implement a microprocessor chip that is compliant with the SPARC specification by securing a license from SPARC International. The SPARC specification is well known and will serve as the basis of the discussion that follows. However, this is not to be interpreted as meaning that the following discussion is strictly limited to the SPARC specification.

Turning first to FIG. 1, a block diagram of relevant portions of an IC 10 is shown. The IC 10 includes a memory control unit (MCU) 12, core logic 14, ASI bus interface logic 16, and one or more memory arrays 18. The ASI bus interface logic 16 and the memory arrays 18 are connected by the ASI bus as shown. One of ordinary skill in the art will recognize that a conventional IC will likely include other blocks that are not shown here in the interest of clarity. The core logic 14 may include a wide assortment of logic for data processing. The core logic 14 may not necessarily be a single entity as shown. The block designated as memory arrays 18 may include any number of memory arrays. The various memory arrays will likely come in different forms and sizes and will likely be located in different regions of the IC. All of the various memory arrays are accessible via an ASI bus. The protocol of the ASI bus is controlled by the ASI bus interface logic 16. The ASI bus may be connected to the ASI bus interface logic 16 in any number of arrangements. The SPARC specification does not dictate the arrangement to be used. Two common arrangements are a loop and a star topology. In the loop topology, a first memory array is connected to the ASI bus interface logic 16 and to a second memory array. The second memory array is in turn connected to a third memory array which is in turn connected to the next memory array. This pattern is continued until the last memory array is connected back to the ASI bus interface logic 16. The memory arrays are said to form a loop or chain. In the star topology, each of the memory arrays is connected directly to the ASI bus interface logic 16 in a radiating pattern that is said to resemble a star. Other arrangements and combinations of arrangements exist. The actual arrangement is not critical so long as, whatever the arrangement, it is known by the ASI bus interface logic 16 so that any latency of accessing a specific memory array can be accounted for. Of course, for the IC designer, the actual arrangement will have implications on the routing area required for the physical implementation of the network of memory arrays 18.

Each of the various memory arrays 18 will include a plurality of memory locations (not shown). The number of memory locations will depend on the circumstances such as the function of the specific memory array. According to the current SPARC specification each of the memory locations is identified by an address consisting of two elements. The first element is a unique ASI for each memory array which distinguishes one memory array from another. For example, if the memory arrays 18 include an instruction cache and a data cache, then each will have a different ASI. The second element is an address which identifies an offset into its associated address space which corresponds to a particular memory location. Taken together, the two elements guarantee that each memory location on the IC has a unique address. The SPARC ASI specification also currently stipulates a data field, a read-strobe, and a write-strobe. Taken together these elements are collectively referred to as the ASI bus protocol of a SPARC microprocessor. The ASI bus standardizes the access of all of the memory arrays without necessitating knowledge of their physical structure.

BRIEF DESCRIPTION OF THE INVENTION

A system for on-chip testing of embedded memories using Address Space Identifier (ASI) bus in Scalable Processor ARChitecture (SPARC) microprocessors is disclosed. An integrated circuit includes a plurality of memory arrays, Address Space Identifier (ASI) bus interface logic connected by an ASI bus to the plurality of memory arrays, and a memory control unit and a memory built-in self-test (MBIST) engine connected to the ASI bus interface logic. Rather than direct access, the MBIST engine utilizes the ASI bus interface logic and the ASI bus to perform memory testing. The MBIST engine, programmed with memory array parameters, includes a programmable state machine controller to which is connected a programmable data generator, a programmable address generator, and a programmable comparator. The data generator provides data as appropriate. The address generator provides addresses as appropriate. The comparator provides test results information for the particular test situation. The MBIST engine generates a test status output. Depending on the specific memory array to be tested, the appropriate parameters of that memory array are programmed to configure the MBIST engine to test that memory array.

BRIEF DESCRIPTION OF THE DRAWINGS

The accompanying drawings, which are incorporated into and constitute a part of this specification, illustrate one or more exemplary embodiments of the present invention and, together with the detailed description, serve to explain the principles and exemplary implementations of the invention.

In the drawings.

DETAILED DESCRIPTION OF THE INVENTION

Various exemplary embodiments of the present invention are described herein in the context of on-chip testing of embedded memories using ASI bus in SPARC architectures. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to exemplary implementations of the present invention as illustrated in the accompanying drawings. The same reference indicators will be used throughout the drawings and the following detailed descriptions to refer to the same or like parts.

In the interest of clarity, not all of the routine features of the exemplary implementations described herein are shown and described. It will of course, be appreciated that in the development of any such actual implementation, numerous implementation-specific decisions must be made in order to achieve the specific goals of the developer, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
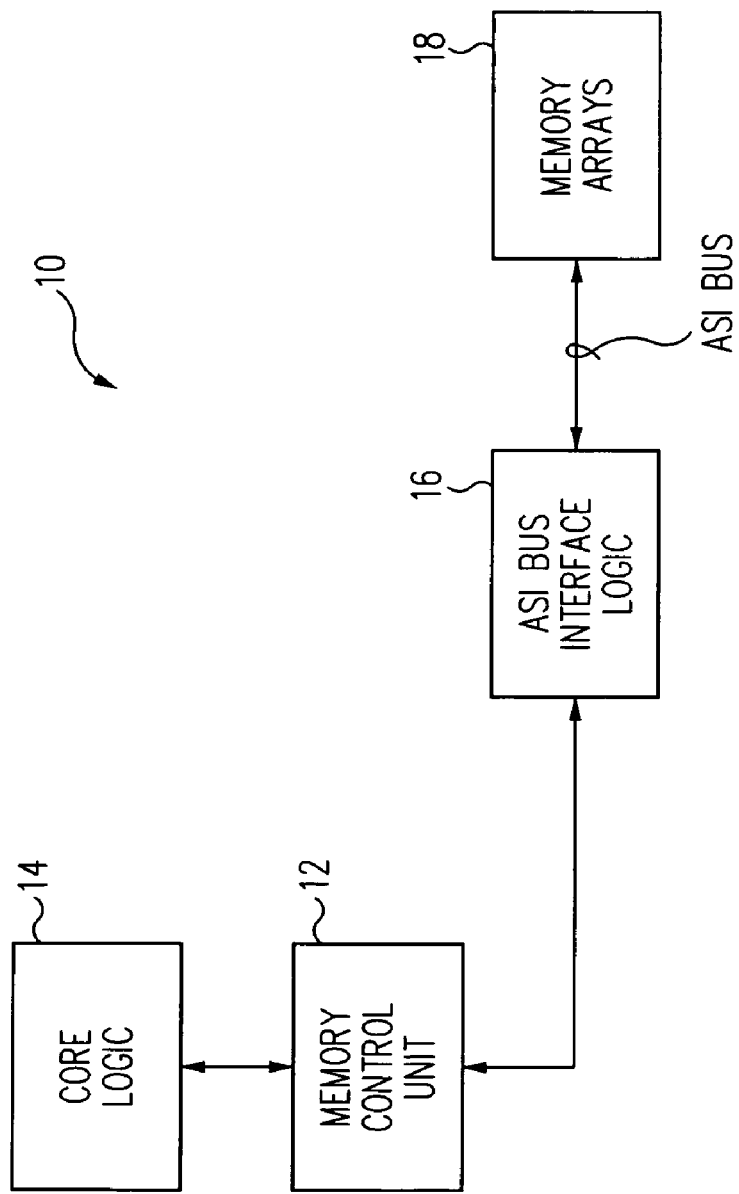
FIG. 1 is a block diagram of relevant portions of an IC.
Figure 2:
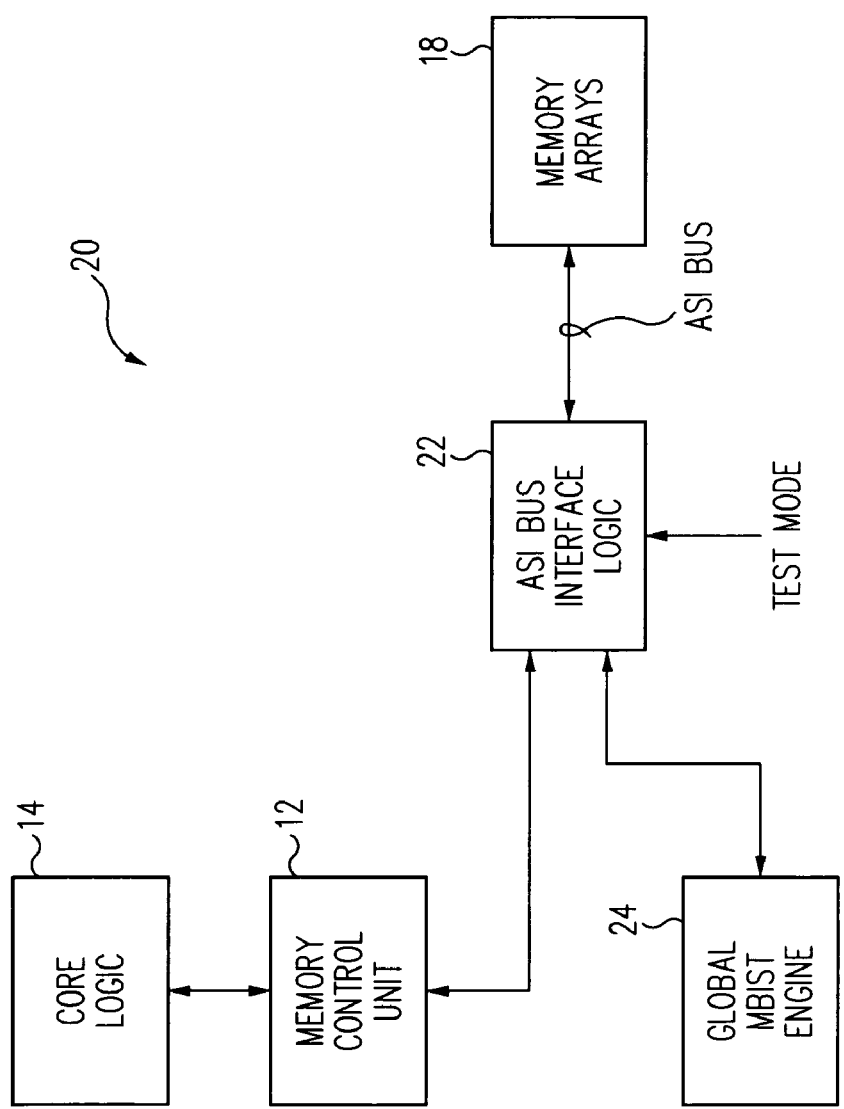
FIG. 2 is a block diagram of relevant portions of an IC according to one embodiment of the present invention.

Turning now to FIG. 2, a block diagram of relevant portions of an IC 20 according to one embodiment of the present invention is shown. The IC 20 includes an MCU 12, core logic 14, memory arrays 18, ASI bus interface logic 22, and an MBIST engine 24. The core logic 14 and the memory arrays 18 may be essentially the same as in FIG. 1. The ASI bus interface logic 22, however, has been modified to accommodate the MBIST engine 24. Under normal operations of the IC 20, the ASI bus interface logic 22 will make the ASI bus available only to the MCU 12. Under memory testing operations of the IC 20, the ASI bus interface logic 22 will be switched via the test mode input shown to make the ASI bus available to the MBIST engine 24. The MBIST engine 24 utilizes the ASI bus interface logic 22 and the ASI bus to access the memory arrays 18 for memory testing. Using this configuration, the MBIST engine 24 need not be directly connected to each of the various memory arrays. To the IC designer, this represents a savings in wire routing relative to the conventional central manner of on-chip test circuitry organization. This savings is balanced against the cost of a more complex MBIST engine 24.

Figure 3:
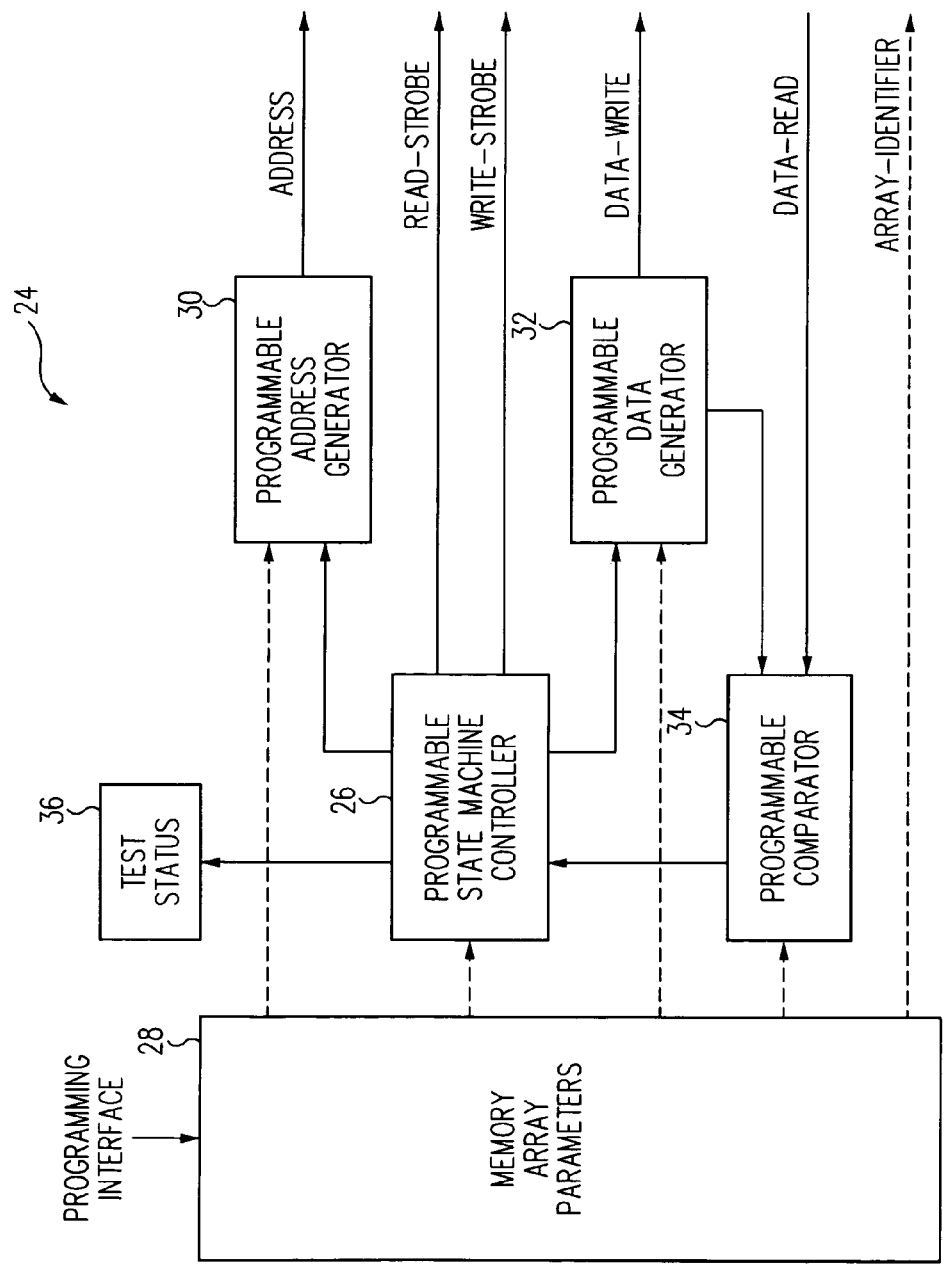
FIG. 3 is a block diagram according to one embodiment of the present invention of the MBIST engine of FIG. 2.

Turning now to FIG. 3, a block diagram according to one embodiment of the present invention of the MBIST engine 24 of FIG. 2 is shown. The MBIST engine 24 includes an programmable state machine controller 26, memory array parameters 28, a programmable address generator 30, a programmable data generator 32, a programmable comparator 34, and a test status 36. As an example, the components are connected as shown and have at least six input/output connections as shown to the ASI bus interface logic 22 of FIG. 2. The ARRAY-IDENTIFIER output might alternatively originate from the controller 26, among others. The controller 26 is the hub of the MBIST engine 24. The controller 26 coordinates the other components to accomplish the task of memory testing.

Before memory testing can be undertaken however, the MBIST engine 24 must be aware of the configuration of the memory arrays 18 of FIG. 2. Information relevant to the proper testing of the memory arrays 18 may at least in part be collected in the memory array parameters 28, in one or more of the components 26, 30, 32, and 34, or in a combination of the components. It is possible that all of the information may be stored such that the memory array parameters 28 can be deleted as unnecessary. Prior to or during memory testing, this information may be collected internally by the MBIST engine 24 or it may be loaded from an external source such as via the programming interface shown. One embodiment entails preloading at least a portion of such information during the manufacturing of the IC. The information needed may depend in part on the test algorithm to be performed and in part on the memory array itself. This information may include the ASI and addresses for each memory location of the various memory arrays, the mapping of the logical address space of the various memory arrays to the physical bit map of the various memory arrays, and any read/write latencies in communication between the various memory arrays and the MBIST engine 24.

Similarly, before memory testing, the MBIST engine 24 must know what test algorithm or algorithms are to be performed. The test algorithms may be embedded in the MBIST engine 24 or they may be loaded from an external source. The test algorithms, through the controller 26, call on the data generator 32 to generate the appropriate data for the circumstances and call on the address generator 30 to generate the appropriate addresses for the circumstances. The comparator 34 evaluates the results of the application of the test algorithm to a particular memory array and reports to the controller 26. The form of this evaluation may depend at least in part on the particular test algorithm. For example, one form of evaluation is a simple bit by bit comparison to check whether the write bits are the same as the read bits. Finally, the controller 26 generates a test status 36 for the user. The test status 36 may take one or more of many shapes. For example, the test status 36 may be as simple as a pass/fail indication or it may be a more complete test message. Optionally, the controller 26 may institute an action in addition to or in place of the test status 36. For example, such an action may include enabling or disabling a particular memory location. By utilizing the ASI bus, the MBIST engine 24 enables a highly credible at-speed memory test. Furthermore, not only are the memory arrays tested, but so too the ASI bus itself is tested.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An integrated circuit comprising:
   a plurality of memory arrays;
   Address Space Identifier (ASI) bus interface logic connected by an ASI bus to the plurality of memory arrays, wherein the ASI bus interface logic controls access to the plurality of memory arrays;
   a memory control unit connected to the ASI bus interface logic; and
   a memory built-in self-test (MBIST) engine connected to the ASI bus interface logic, wherein the MBIST engine utilizes the ASI bus interface logic to perform memory testing on at least one of the plurality of memory arrays.

2. The integrated circuit as defined in claim 1, wherein the MBIST engine further comprises:
   a programmable state machine controller;
   a programmable data generator connected to the controller, wherein the data generator provides data appropriate for a particular test situation;
   a programmable address generator connected to the controller, wherein the address generator provides addresses appropriate for the particular test situation; and
   a programmable comparator connected to the controller, wherein the comparator provides test results information for the particular test situation to the controller.

3. The integrated circuit as defined in claim 2, wherein the MBIST engine further comprises a storage connected to the controller, wherein the storage contains information for the controller.

4. The integrated circuit as defined in claim 1, wherein the MBIST engine generates a test output as a product of the memory testing.

5. The integrated circuit as defined in claim 4, wherein the MBIST engine institutes an action as a product of the memory testing.

6. The integrated circuit as defined in claim 1, wherein the MBIST engine institutes an action as a product of the memory testing.

7. A memory built-in self-test (MBIST) engine for an integrated circuit having a plurality of memory arrays, Address Space Identifier (ASI) bus interface logic connected by an ASI bus to the plurality of memory arrays, and a memory control unit connected to the ASI bus interface logic, wherein the MBIST engine utilizes the ASI bus interface logic to perform memory testing on at least one of the plurality of memory arrays, the MBIST engine comprising:
   a programmable state machine controller;
   a programmable data generator connected to the controller, wherein the data generator provides data appropriate for a particular test situation;
   a programmable address generator connected to the controller, wherein the address generator provides addresses appropriate for the particular test situation; and
   a programmable comparator connected to the controller, wherein the comparator provides test results information for the particular test situation to the controller.

8. The MBIST engine as defined in claim 7, further comprising a storage connected to the controller, wherein the storage contains information for the controller.

9. The MBIST engine as defined in claim 7, wherein the MBIST engine generates a test output as a product of the memory testing.

10. The MBIST engine as defined in claim 9, wherein the MBIST engine institutes an action as a product of the memory testing.

11. The MBIST engine as defined in claim 7, wherein the MBIST engine institutes an action as a product of the memory testing.

12. A method of memory built-in self-test (MBIST) for an integrated circuit having a plurality of memory arrays, Address Space Identifier (ASI) bus interface logic connected by an ASI bus to the plurality of memory arrays, a memory control unit connected to the ASI bus interface logic, and an MBIST engine connected to the ASI bus interface logic, the method comprising:
   utilizing the ASI bus interface logic to perform memory testing on at least one of the plurality of memory arrays.

13. The method as defined in claim 12, further comprising generating a test output as a product of the memory testing.

14. The method as defined in claim 13, further comprising instituting an action as a product of the memory testing.

15. The method as defined in claim 12, further comprising instituting an action as a product of the memory testing.

16. An apparatus for memory built-in self-test (MBIST) for an integrated circuit having a plurality of memory arrays, Address Space Identifier (ASI) bus interface logic connected by an ASI bus to the plurality of memory arrays, a memory control unit connected to the ASI bus interface logic, and an MBIST engine connected to the ASI bus interface logic, the apparatus comprising:
   means for utilizing the ASI bus interface logic to perform memory testing on at least one of the plurality of memory arrays.

17. The apparatus as defined in claim 16, further comprising means for generating a test output as a product of the memory testing.

18. The apparatus as defined in claim 16, further comprising means for instituting an action as a product of the memory testing.

19. The apparatus as defined in claim 16, further comprising means for instituting an action as a product of the memory testing.

* * * * *